(12) United States Patent
Lambert et al.

(10) Patent No.: US 10,843,645 B1
(45) Date of Patent: Nov. 24, 2020

(54) INDEPENDENT POWER CONTROL AND OUTPUT ACCESS FOR VEHICLE DEVICES

(71) Applicant: Lytx, Inc., San Diego, CA (US)

(72) Inventors: Daniel Lambert, Carlsbad, CA (US); Angel Valdes, San Diego, CA (US)

(73) Assignee: Lytx, Inc., San Diego, CA (US)

( * ) Notice: Subject to any disclaimer, the term of this patent is extended or adjusted under 35 U.S.C. 154(b) by 72 days.

(21) Appl. No.: 16/012,612

(22) Filed: Jun. 19, 2018

(51) Int. Cl.
| | | |
|---|---|---|
| *H02J 7/34* | (2006.01) | |
| *B60R 16/033* | (2006.01) | |
| *B60R 16/023* | (2006.01) | |
| *H05K 1/00* | (2006.01) | |
| *B60L 1/00* | (2006.01) | |
| *B60Q 1/14* | (2006.01) | |
| *H05B 33/08* | (2020.01) | |

(52) U.S. Cl.
CPC .............. *B60R 16/033* (2013.01); *B60L 1/00* (2013.01); *B60R 16/0232* (2013.01); *H02J 7/34* (2013.01); *H05K 1/00* (2013.01); *B60Q 1/14* (2013.01); *H05B 33/08* (2013.01)

(58) Field of Classification Search
CPC .... H02J 7/34; H02J 7/0027; H02J 9/00; H02J 2007/005; H02J 2007/037; F21L 4/08; H01M 10/46; B60Q 1/14; B60Q 1/1415; H05B 33/08; H05B 33/0812; H05B 33/0815

USPC .............. 307/9.1, 10.1, 150, 31; 361/1, 437; 381/86
See application file for complete search history.

(56) References Cited

U.S. PATENT DOCUMENTS

| | | | | |
|---|---|---|---|---|
| 2010/0032492 | A1* | 2/2010 | Grimm | A01M 7/0089 239/1 |
| 2011/0194277 | A1* | 8/2011 | Yamaguchi | H02J 7/34 362/183 |
| 2014/0347873 | A1* | 11/2014 | Robertson | B60Q 1/24 362/485 |
| 2015/0183325 | A1* | 7/2015 | Mitsutani | B60L 50/61 307/10.1 |
| 2017/0066366 | A1* | 3/2017 | Jwania | B60Q 1/1415 |
| 2019/0329729 | A1* | 10/2019 | Hilligardt | G05D 1/0088 |

* cited by examiner

*Primary Examiner* — Rexford N Barnie
*Assistant Examiner* — Jagdeep S Dhillon
(74) *Attorney, Agent, or Firm* — Van Pelt, Yi & James LLP

(57) ABSTRACT

A system for providing power includes a control and a switch. The control is configured to indicate providing parallel power to a vehicle mounted device. The switch is configured to connect power in parallel to the vehicle mounted device, where connecting power in parallel includes back current protection.

17 Claims, 9 Drawing Sheets

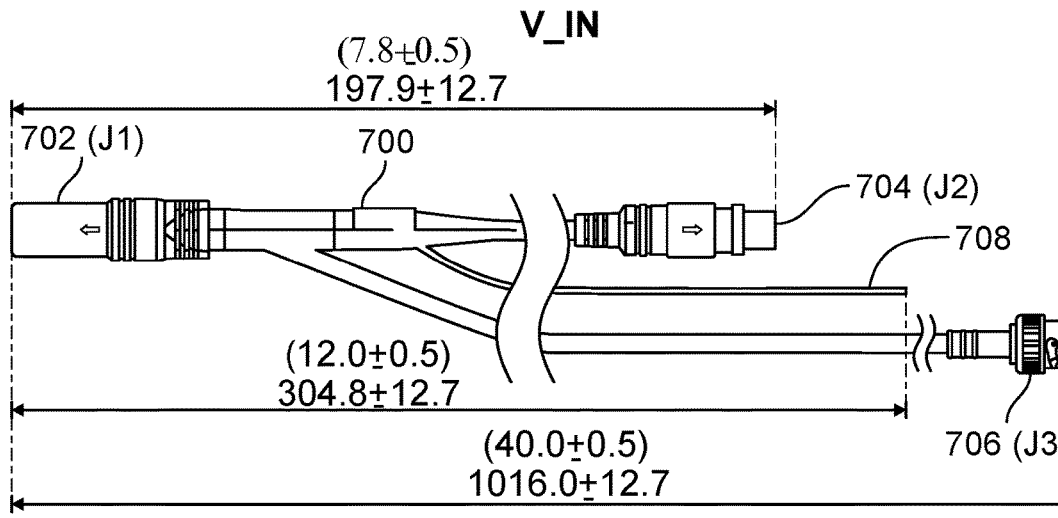
FIG. 7A
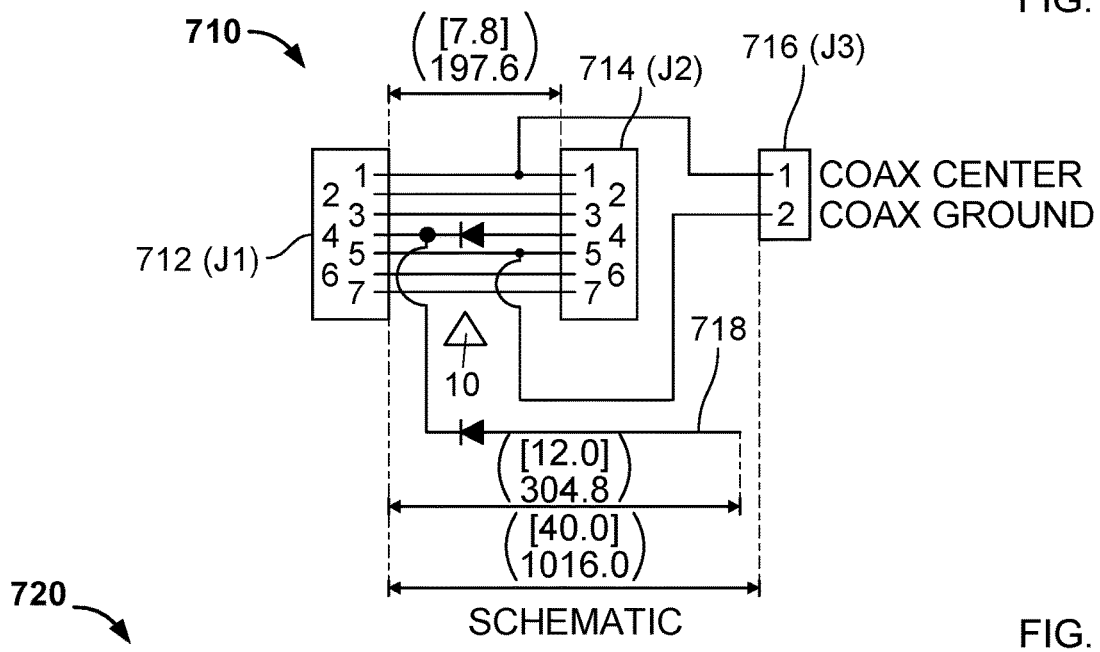
SCHEMATIC
FIG. 7B
| J1 | | | J2 | J3 | NOTES |
|---|---|---|---|---|---|
| 1 | Yellow | Video | 1 | 1 | |
| 2 | Blue | Trig | 2 | | |
| 3 | White | White | 3 | | |
| 4 | Red | 12V+ | 4 | | V_IN (LOOSE WIRE) |
| 5 | Black | Ground | 5 | 2 | |
| 6 | Grey | Video shield | 6 | | |
| 7 | Black | DIN shield | 7 | | |
FIG. 7C

INDEPENDENT POWER CONTROL AND OUTPUT ACCESS FOR VEHICLE DEVICES

BACKGROUND OF THE INVENTION

Typically, a vehicle camera system is turned on and shut off with switch power as the camera supports driving functions. For example, a backup camera is powered on when the transmission is placed in reverse and turned off until the transmission is place in drive. However, this is a problem in the event that the vehicle camera system is useful for situations different from the use case designed into the vehicle operating system.

BRIEF DESCRIPTION OF THE DRAWINGS

Various embodiments of the invention are disclosed in the following detailed description and the accompanying drawings.

FIG. 7A is a diagram illustrating an embodiment of a 'Y' connector.

FIG. 7B is a diagram illustrating an embodiment of a 'Y' connector.

FIG. 7C is a table illustrating an embodiment of a 'Y' connector.

DETAILED DESCRIPTION

Figure 1:
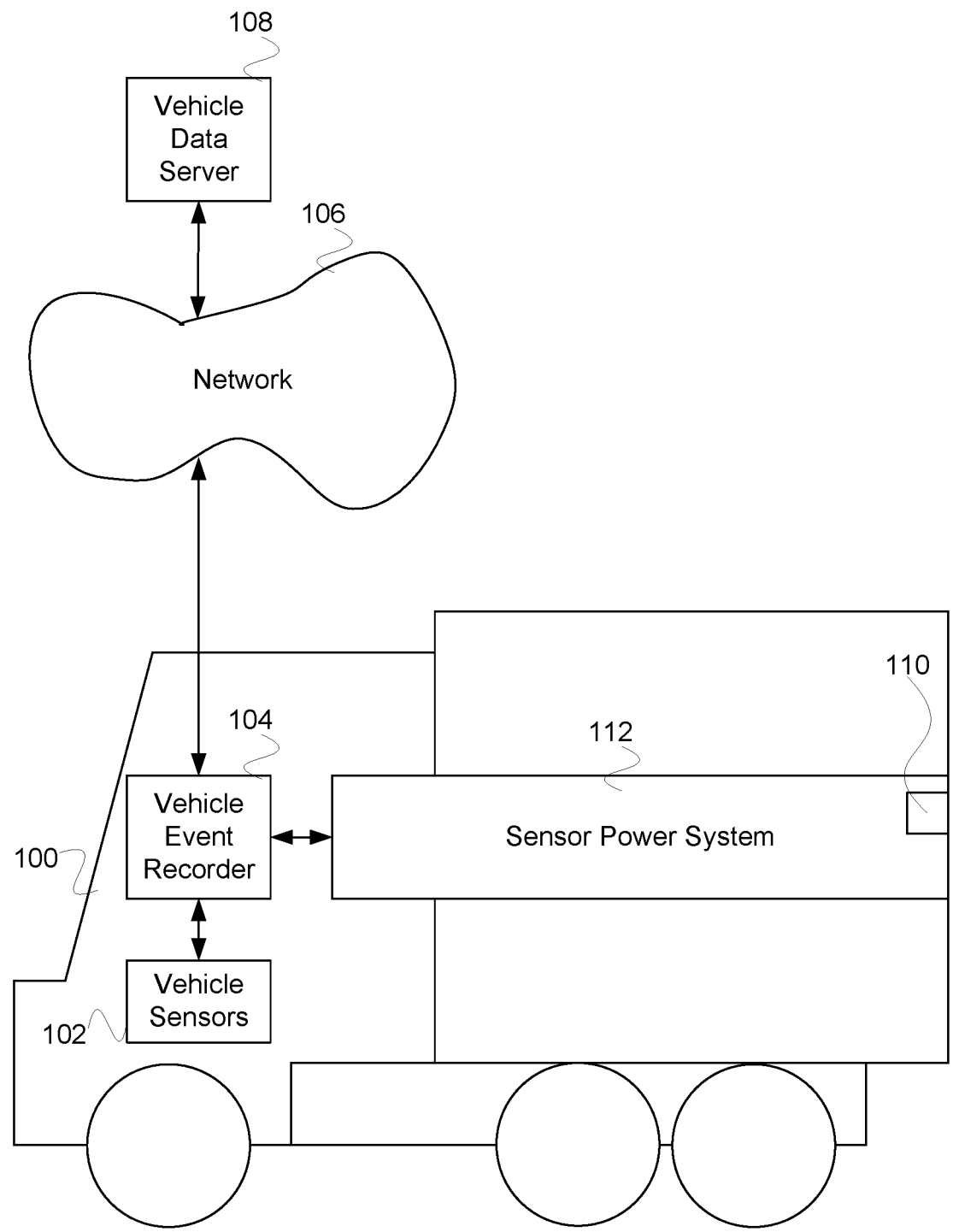
FIG. 1 is a block diagram illustrating an embodiment of a system including a vehicle event recorder.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for independent power control and output access for vehicle devices is disclosed. The system comprises a control and a switch. The control is configured to indicate providing parallel power to a vehicle mounted device. The switch is configured to connect power in parallel to the vehicle mounted device, where connecting in power in parallel includes back current protection.

The system is designed to enable the use of devices (e.g., sensors) associated with a vehicle when the device is not designed to be used for the vehicle system. The system does not interfere with the designed use for the vehicle, but enables parallel use. Any vehicle device including a backup camera can fall under the scenario addressed by the disclosed system. Other devices might include a camera, a video camera, a distance sensor, a sonar sensor, a lidar sensor, a radar sensor, a stereo camera sensor, an audio sensor, a laser sensor, an IR sensor, a lane detection sensor or any other appropriate vehicle sensor. The system is designed such that parallel power is provided to a vehicle device so that it can be powered when desired outside of the typical vehicle function and the output of the device is also provided to an additional system. For example, the original backing camera is designed to only power the camera when the vehicle is on and the vehicle is in reverse. For integration of with an auxiliary system (e.g., a vehicle event recorder), the camera needs to be on whenever desired by the auxiliary system when the vehicle is on. In some cases, it may also be desired that one or more device (e.g., a camera) needs to be on when the vehicle is off (e.g., for additional time after the vehicle is off—for example, 0.02 hours, 0.25 hours, 4 hours, 8 hours, 12 hours, 18 hours, and/or 60 hours). In some cases, the purposes of an additional camera, such as a cargo camera, are as follows: to assist in proof of transit, proof that no damage due to shifting is present, proof of delivery, and/or security monitoring while parked. Note that for the case of proof of transit the camera may need to be on for the entire time the vehicle is on. Additionally, note that for the case of proof of delivery or security monitoring the camera needs to be on regardless of whether the vehicle is on or off. The upper limit of time that a device can be powered is dependent on the capacity of the vehicle battery. Depending on vehicle configurations, a range of up to 60 hours is possible. For vehicles with supplemental power while parked, there may be no upper limit to vehicle off recording.

In some cases, the system is designed to power each of one or more devices separately. For example, a separate trigger enables separate parallel power (e.g., using a hub) to be provided to an individual device attached to a vehicle. This can reserve power for only relevant devices as well as save memory storage used to store sensor signals.

The system is designed to keep all standard vehicle systems available with fall back to original functionality in the event of a failure of the integrated solution between the auxiliary system and the standard vehicle system. For example, the original vehicle system for assisting backing uses a rear camera. The system design provides parallel power solution that allows the original vehicle backing solution to continue functioning even in the event of a failure with any of the auxiliary system's active components. In some cases. the only added critical path system component is a connector cable which supports pass through of the video and power signals on the original backing camera solution while supplying a video tap to the auxiliary system and a power feed tap from the auxiliary system. Additionally the auxiliary power feeds support back current protection (e.g., diode protections) such that both systems are protected from back currents. In some cases, the power is fed through a power control unit that also fails gracefully in terms of allowing the native power system to operate even if the power control unit is not working properly.

FIG. 1 is a block diagram illustrating an embodiment of a system including a vehicle event recorder. In the example shown, vehicle sensors 102 provide signals to vehicle event recorder 104 including a rear camera 110. In the event vehicle event recorder 104 desires rear camera 110 data outside of the normal vehicle use for rear camera 110, sensor power system 112 powers rear camera 110 in parallel (e.g, where the sensor power system includes a hub and a power control unit) so that rear camera 110 is able to fulfill its normal function and the additional functionality desired by vehicle event recorder 104.

Vehicle event recorder 104 comprises a vehicle event recorder mounted in a vehicle (e.g., a car, a truck, a trailer associated with a garbage truck, a semi truck, a van, a bus, a commercial vehicle, a specialized truck or vehicle, etc.). Vehicle event recorder 104 is in communication with sensors 102. Sensors comprises a sets of sensors on vehicle event recorder 104 or mounted to vehicle 100—for example, one or more video recorders, audio recorders, accelerometers, gyroscopes, vehicle state sensors, proximity sensors, a global positioning system (e.g., GPS), outdoor temperature sensors, moisture sensors, laser line tracker sensors, etc. Vehicle sensors 102 comprise internal vehicle state sensors—for example a speedometer, an accelerator pedal sensor, a brake pedal sensor, an engine revolutions per minute (e.g., RPM) sensor, an engine running sensor, an engine temperature sensor, a headlight sensor, an airbag deployment sensor, driver and passenger seat weight sensors, an anti-locking brake sensor, traction control system sensors, drive wheel speed sensors, shocks sensors, an engine exhaust sensor, a gear position sensor, a cabin equipment operation sensor, etc. Vehicle event recorder 104 comprises a system for receiving and processing sensor data. Processing sensor data comprises filtering data, identifying patterns in data, detecting events, determining triggers, etc. Vehicle event recorder 104 is mounted on vehicle 100 in any appropriate location, for example the chassis, the front grill, the dashboard, the rear-view mirror, the rear window or wall, the floor, etc. There are times when vehicle event recorder 104 comprises multiple units mounted in different locations within vehicle 100 instead of a single unit, particularly when there are space constraints for a given location (e.g., behind the rear view mirror) and more space is required to house electronic components. Vehicle event recorder 104 comprises a communications system for communicating with network 106. Network 106 comprises a network for communications. Network 106 comprises one or more of a wireless network, a wired network, a cellular network, a Code Division Multiple Access (CDMA) network, a Global System for Mobile Communication (GSM) network, a Long-Term Evolution (LTE) network, a Universal Mobile Telecommunications System (UMTS) network, a World-wide Interoperability for Microwave Access (WiMAX) network, a Dedicated Short-Range Communications (DSRC) network, a local area network, a wide area network, the Internet, etc. There are instances when network 106 comprises multiple networks—for instance, multiple interconnected networks spanning different regions, networks operating at different times, overlaid networks with different access permissions, networks with different bandwidth, etc. Different networks comprising network 106 typically comprise different bandwidth cost (e.g., a wired network has a very low cost, a wireless Ethernet connection has a moderate cost, a cellular data network has a high cost). In some embodiments, network 106 has a different cost at different times (e.g., a higher cost during the day and a lower cost at night). Vehicle event recorder 104 communicates with vehicle data server 108 via network 106.

Vehicle data server 108 comprises a vehicle data server for communicating with vehicle event recorder 104 via network 106. Vehicle data server 108 receives data, processes data, stores data, requests more data, provides stored data, provides data for display, interacts with users, etc. Video data received by vehicle data server 108 is stored in a database.

Figure 2:
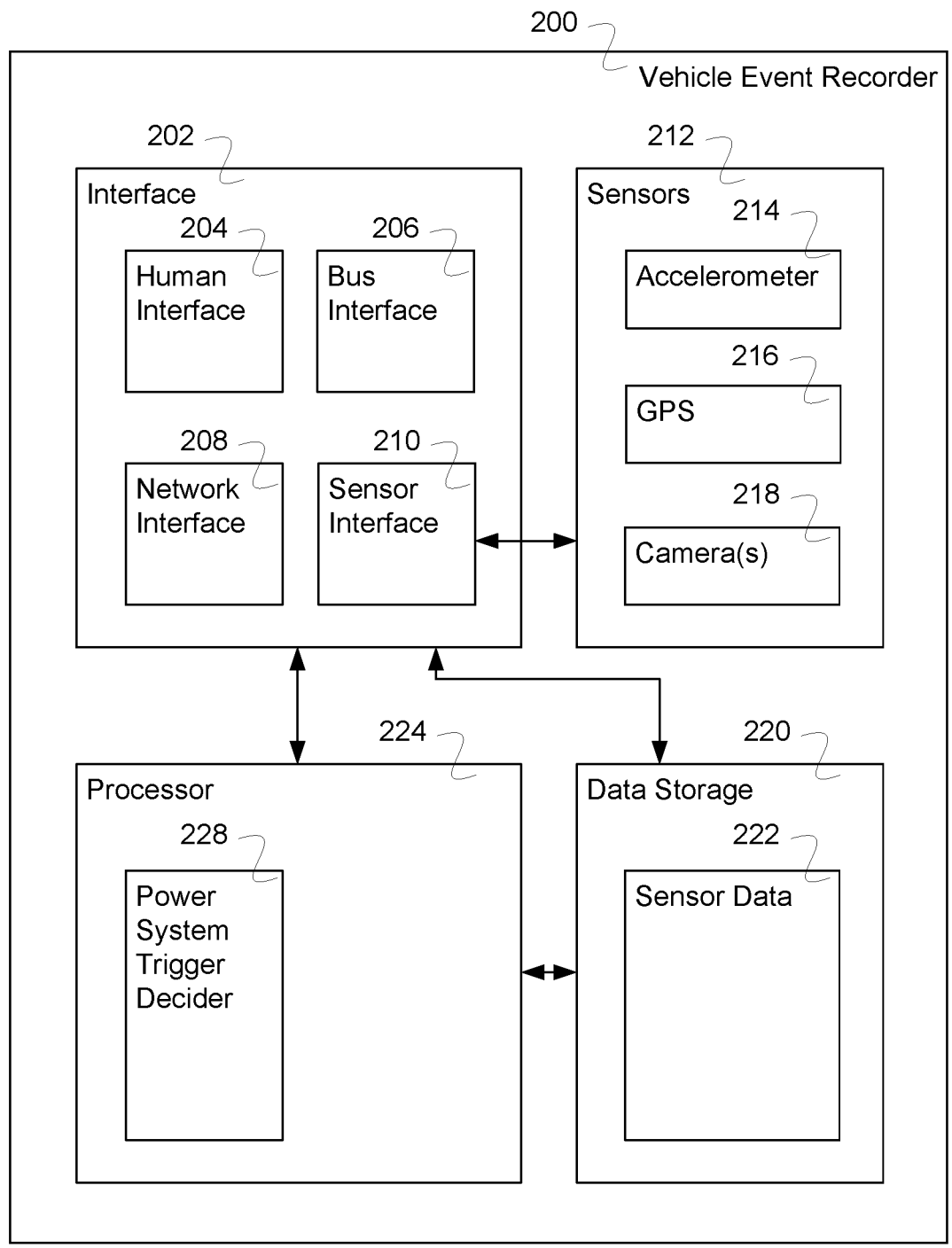
FIG. 2 is a block diagram illustrating an embodiment of a vehicle event recorder.

FIG. 2 is a block diagram illustrating an embodiment of a vehicle event recorder. In some embodiments, vehicle event recorder 200 of FIG. 2 comprises vehicle event recorder 104 of FIG. 1. In the example shown, vehicle event recorder 200 process sensor data using processor 224. Processor 224 receives sensor data via bus interface 206 of interface 202 or sensor interface 210 and from internal sensors (e.g., GPS 216, accelerometer 214, or camera(s) 218 of sensors 212). Processor 224 determines a trigger for parallel powering of a vehicle device or sensor using power system trigger decider 228 enabling vehicle event recorder 200 to receive sensor data in the event that the sensor does not in its native operation provide data at the time desired.

Vehicle event recorder 200 comprises interface 202. Interface 202 comprises a set of interfaces to other systems. Human interface 204 comprises an interface to a human interaction system—for example, an audio output, a display output, etc. Bus interface 206 comprises an interface to a bus for receiving data from one or more vehicle state sensors coupled electrically to a bus. Sensor interface 210 comprises an interface to one or more vehicle event recorder sensors. In various embodiments, vehicle event recorder sensors (e.g., sensors 212) comprise an exterior video camera (e.g., camera(s) 218), an exterior still camera (e.g., camera(s) 218), an interior video camera (e.g., camera(s) 218), an interior still camera (e.g., camera(s) 218), a microphone, an accelerometer (e.g., accelerometer 214), a gyroscope, an outdoor temperature sensor, a moisture sensor, a laser line tracker sensor, vehicle state sensors, positioning sensor (e.g., GPS 216), or any other appropriate sensors. In various embodiments, vehicle state sensors comprise a speedometer, an accelerator pedal sensor, a brake pedal sensor, an engine revolutions per minute (RPM) sensor, an engine temperature sensor, a headlight sensor, an airbag deployment sensor, driver and passenger seat weight sensors, an anti-locking brake sensor, shocks sensors, an engine exhaust sensor, a gear position sensor, a turn signal sensor, a cabin equipment operation sensor, or any other appropriate vehicle state sensors. In some embodiments, bus interface 206 comprises a vehicle bus (e.g., society of automotive engineers (SAE) J1939, J1708/J1587, OBD-II, CAN BUS, etc.). In some embodiments, vehicle event recorder 300 communicates with vehicle state sensors via the vehicle bus. In some embodiments, vehicle event recorder 300 includes a hub that comprises multiple sensor inputs of the same type (e.g., 4 camera sensor inputs).

Bus interface 206 comprises an interface to one or more vehicle control systems (e.g., for adjusting vehicle control parameters, for putting the vehicle in a safe mode, for adjusting an automatic driving control parameter, etc.). Bus interface 206 also interfaces to a system that enables providing parallel power to vehicle device (e.g., to a hub and/or to a power control unit). Network interface 208 comprises a network interface for communicating with other systems via a network (e.g., network 106 of FIG. 1). Network interface 208 comprises one or more of a GSM interface, a CDMA interface, an LTE interface, a WiFi™ interface, an Ethernet interface, a Universal Serial Bus (USB) interface, a Bluetooth™ interface, an Internet interface, etc. Processor 224 comprises a processor for controlling the operations of vehicle event recorder 200, for reading and writing information on data storage 220 (e.g., sensor data in sensor data 222), for reading and/or writing data via interface 202, etc. Processor 224 comprises an event detector for determining events from data (e.g., video data, sensor data, etc.) and deciding triggers with power system trigger decider 228.

Data storage 220 comprises a data storage (e.g., a random access memory (RAM), a read only memory (ROM), a nonvolatile memory, a flash memory, a hard disk, or any other appropriate data storage). Data storage 220 comprises a data storage for storing instructions for processor 224, vehicle event recorder data, vehicle event data, sensor data, video data, vehicle information, vehicle identifying information, anomalous event information, etc. Data storage 220 stores continuous video data or other sensor data comprising stored continuous video data from one or more cameras mounted on the vehicle for a previous time period (e.g., 1 minute, 5 minutes, 1 hour, 1 day, etc.).

Figure 3:
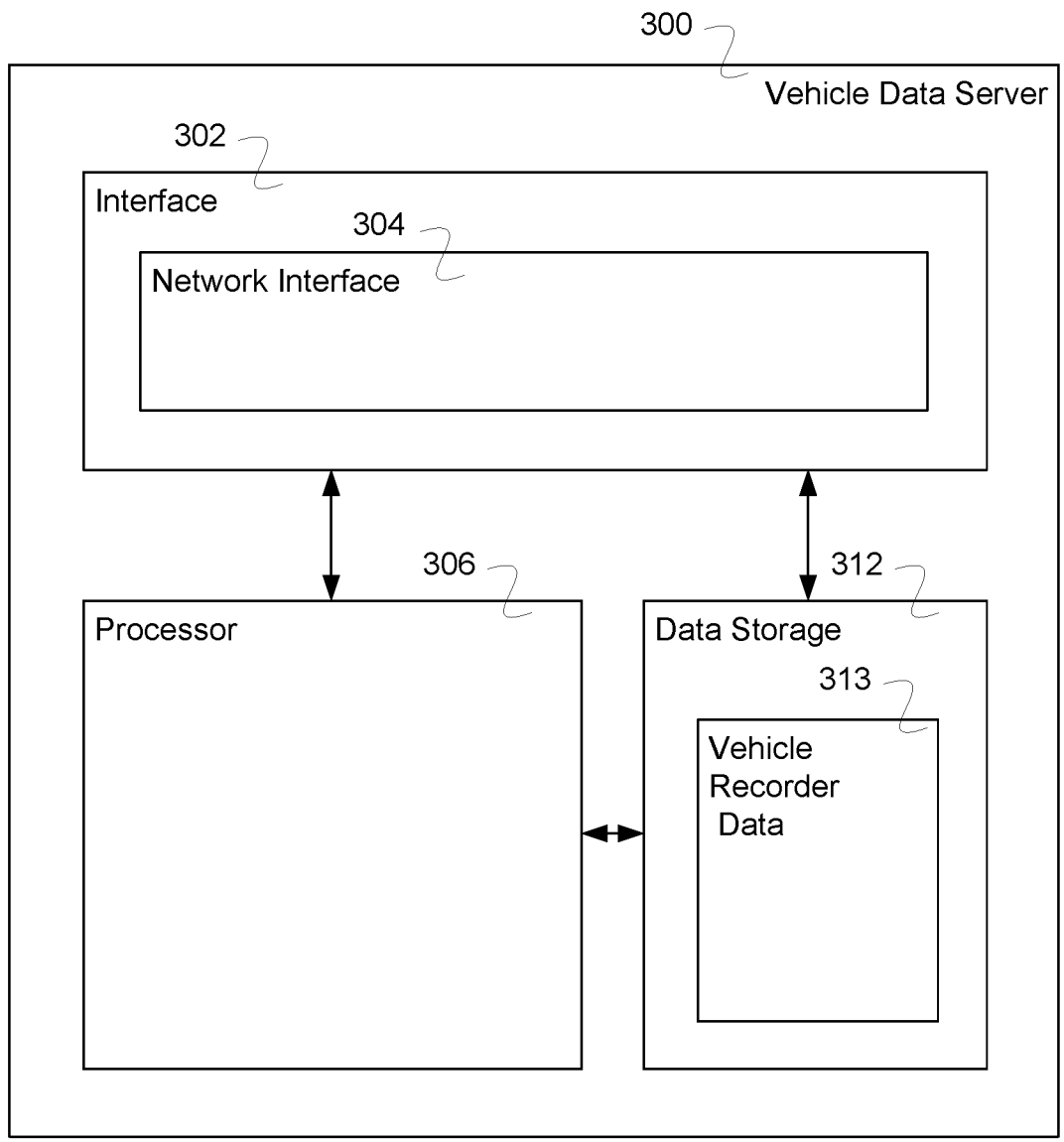
FIG. 3 is a block diagram illustrating an embodiment of a vehicle data server.

FIG. 3 is a block diagram illustrating an embodiment of a vehicle data server. In some embodiments, vehicle data server 300 comprises vehicle data server 108 of FIG. 1. In the example shown, vehicle data server 300 receives vehicle event recorder data via network interface 304 of interface 302. Vehicle event recorder data is stored in vehicle recorder data 313 of data storage 312.

Figure 4A:
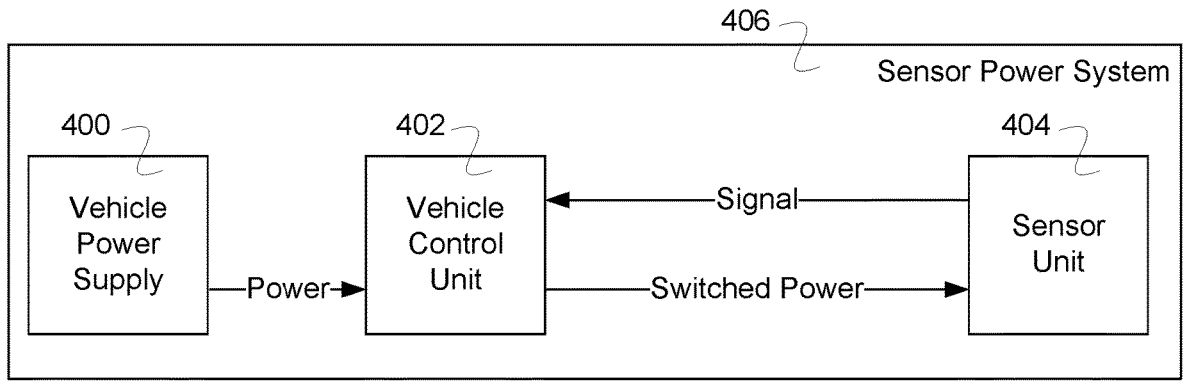
FIG. 4A is a block diagram illustrating an embodiment of a sensor power system.

FIG. 4A is a block diagram illustrating an embodiment of a sensor power system. In some embodiments, sensor power system 406 of FIG. 4A is a prior art sensor power system for a vehicle (e.g., vehicle 100 of FIG. 1). In the example shown, sensor power system 406 includes vehicle power supply 400 (e.g., a vehicle battery or alternator) that supplies power to vehicle control unit 402. Vehicle control unit 402 provides switched power to sensor unit 404 in the event that sensor signal data is desired. Sensor unit 404 provides data signal to vehicle control unit 402. For example, in the event that a vehicle is put into reverse, vehicle control unit 402 provides switched power to sensor unit 404 (e.g., a rear camera) and receives video data signals from sensor unit 404.

Figure 4B:
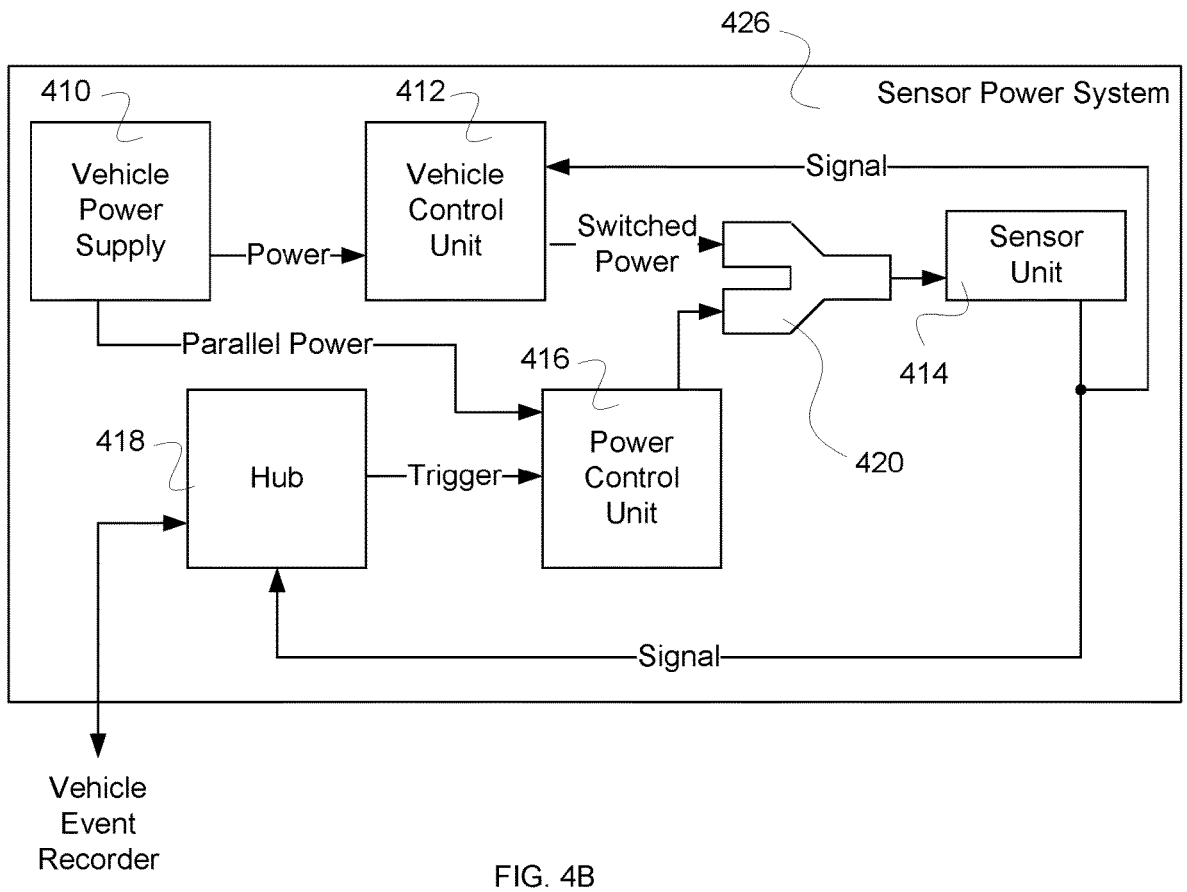
FIG. 4B is a block diagram illustrating an embodiment of a sensor power system.

FIG. 4B is a block diagram illustrating an embodiment of a sensor power system. In some embodiments, sensor power system 426 of FIG. 4B is used to implement sensor power system 112 for vehicle 100 of FIG. 1. In the example shown, sensor power system 426 includes vehicle power supply 410 (e.g., a vehicle battery or alternator) that supplies power to vehicle control unit 412. Vehicle control unit 412 provides switched power to sensor unit 414 in the event that sensor signal data is desired. Sensor unit 414 provides data signal to vehicle control unit 412. For example, in the event that a vehicle is put into reverse, vehicle control unit 412 provides power to sensor unit 414 (e.g., a rear camera) and receives video data signals from sensor unit 414. Sensor unit 414 output signal is also desired by vehicle event recorder system. Parallel power is sourced from vehicle power supply 410 and switched through power control unit 416 when triggered by hub 418. In some embodiments, the functionality of hub 418 is performed by a vehicle event recorder. Power is provided in parallel using 'Y' 420 to sensor unit 414. 'Y' 420 provides power to base of 'Y' that is connected to sensor unit 414. Switched power from vehicle control unit 412 is connected to one branch of 'Y' 420. The switched power is sourced from vehicle power supply 410 and is switched to be connected to sensor unit 414 when sensor unit signal data is desired by the vehicle systems. Parallel power from power control unit 416 is connected to the other branch of 'Y' 420. The parallel power is sourced from vehicle power supply 410 and is triggered to be connected to sensor unit 414 when sensor unit signal data is desired by vehicle event recorder systems as triggered using hub 418. Signal data from sensor unit 414 is provided to hub 418 and is ultimately provided to vehicle event recorder. 'Y' 420 includes back current protection for both branches of 'Y' 420 so that no current is supplied to the branch not supplying power to sensor unit 414. In various embodiments, the back current protection comprises diodes in one branch, both branches of the 'Y' 420, or any other appropriate back current protection. In various embodiments, 'Y' 420 comprises a cable with connectors at each end. 'Y' 420 design allows for no interruption in the base vehicle function in the event that the parallel power path fails.

Figure 4C:
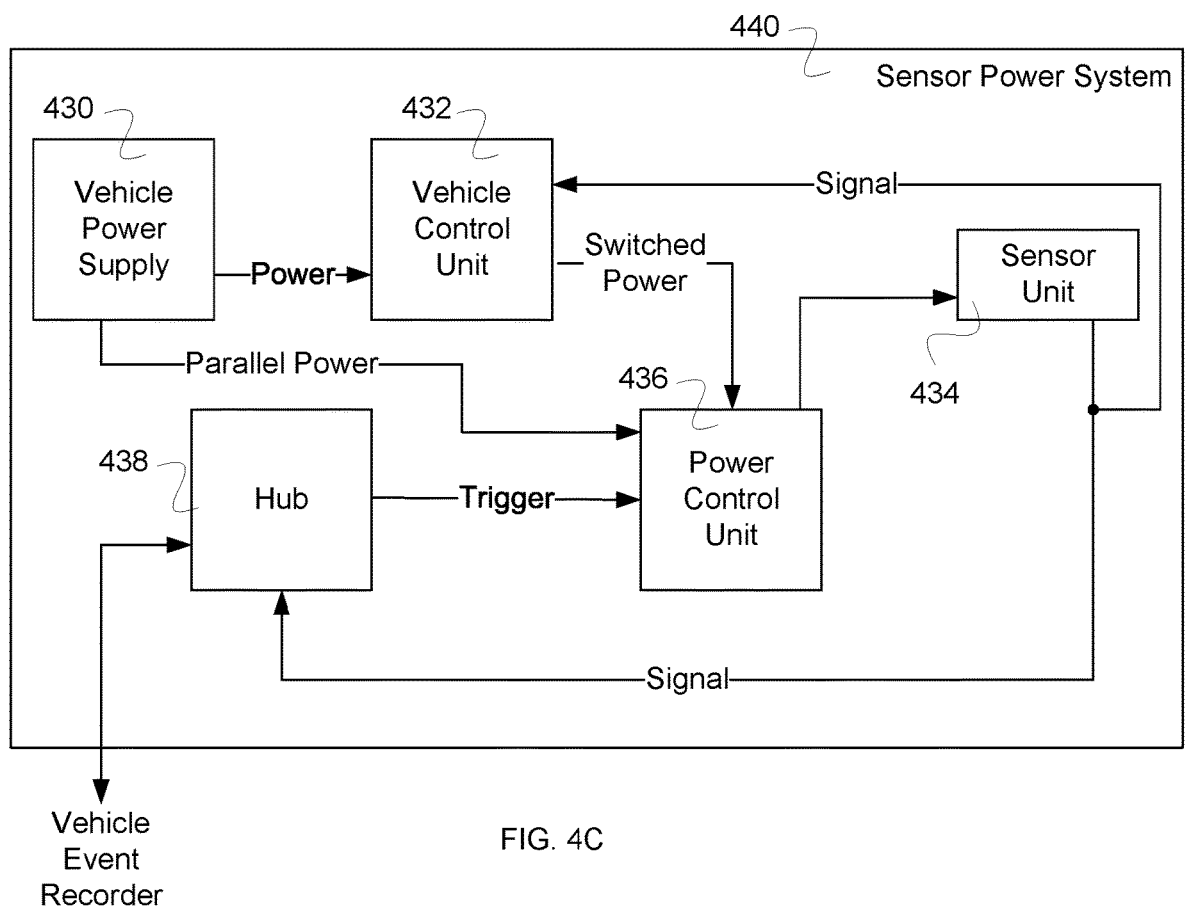
FIG. 4C is a block diagram illustrating an embodiment of a sensor power system.

FIG. 4C is a block diagram illustrating an embodiment of a sensor power system. In some embodiments, sensor power system 440 of FIG. 4C is used to implement sensor power system 112 for vehicle 100 of FIG. 1. In the example shown, sensor power system 440 includes vehicle power supply 430 (e.g., a vehicle battery or alternator) that supplies power to vehicle control unit 432. Vehicle control unit 432 provides switched power via a diode found in PCU 436 to sensor unit 434 in the event that sensor signal data is desired. Sensor unit 434 provides data signal to vehicle control unit 432. For example, in the event that a vehicle is put into reverse, vehicle control unit 432 provides power to sensor unit 434 (e.g., a rear camera) and receives video data signals from sensor unit 434. Sensor unit 434 output signal is also desired by vehicle event recorder system. Parallel power is sourced from vehicle power supply 430 and switched through power control unit 436 when triggered by hub 438. Power is provided to sensor unit 434 from power control unit 436. Switched power from vehicle control unit 432 is connected to power control unit 436. The switched power is sourced from vehicle power supply 430 and is switched to be connected to sensor unit 434 when sensor unit signal data is desired by the vehicle systems. Parallel power is sourced from vehicle power supply 430 and is triggered to be connected to sensor unit 434 when sensor unit signal data is desired by vehicle event recorder systems as triggered using hub 438. Signal data from sensor unit 434 is provided to hub 438 and is ultimately provided to vehicle event recorder. Power control unit 436 includes back current protection so that no current is supplied to the inputs not supplying power to sensor unit 434. In various embodiments, the back current protection comprises diodes in along one path in power control unit 436, in both paths in power control unit 436, or any other appropriate back current protection. Power control unit 436 design allows for no interruption in the base vehicle function in the event that the parallel power path fails.

Figure 5:
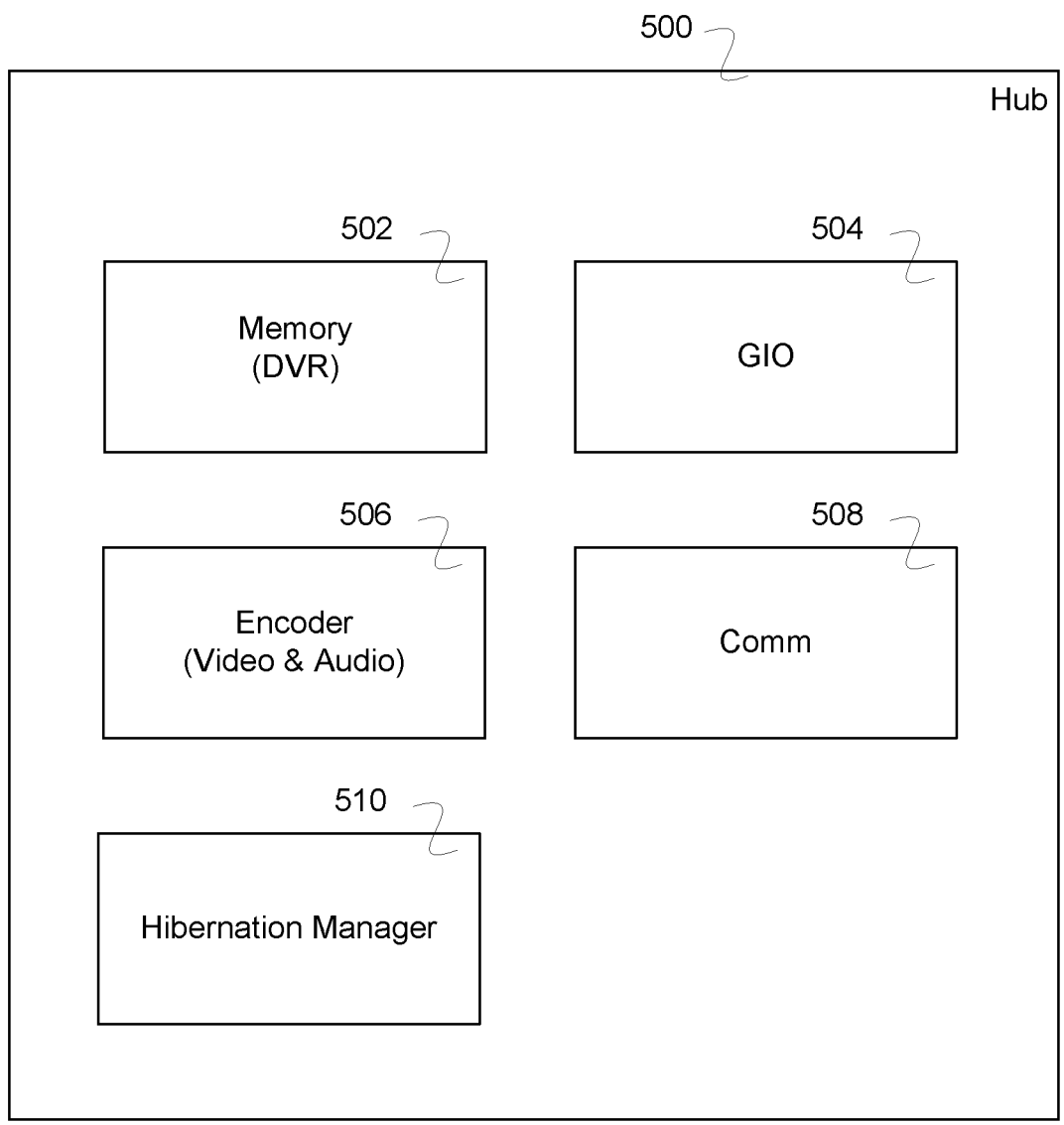
FIG. 5 is a diagram illustrating an embodiment of a hub.

FIG. 5 is a diagram illustrating an embodiment of a hub. In some embodiments, hub 500 of FIG. 5 is used to implement hub 418 of FIG. 4B or hub 438 of FIG. 4C. In some embodiments, the functionality of the hub is performed by a vehicle event recorder. In the example shown, hub 500 includes memory 502, general input/output (GIO) 504, Encoder 506, Comm 508, and hibernation manager 510. Memory 502 comprises a digital video recorder (DVR)—for example, a hardware device for recording video data on a semiconductor memory (e.g., a micro secure digital (SD) card, a flash memory, etc.). Encoder 506 encodes one or more audio and/or video streams to be stored using memory 502. Hibernation manager 510 is configured to turn on when vehicle power is turned on and turned off after a hibernation delay after vehicle power is turned off. Hibernation manager 510 is able to provide trigger for parallel power to a sensor unit when the vehicle power is on or when the vehicle power is off within a hibernation delay. GIO 504 supports multiple trigger input and trigger output lines. In some embodiments, trigger input is passed through to trigger output based on the hibernation logic. In some embodiments, input triggers come from a vehicle event recorder. Comm 508 supports Ethernet local area network communication and communication with a vehicle event recorder to support memory 502 access for video transfers and for streaming of video. In some embodiments, comm 508 includes over air communications (e.g., wifi and/or cellular communication functionality).

Figure 6:
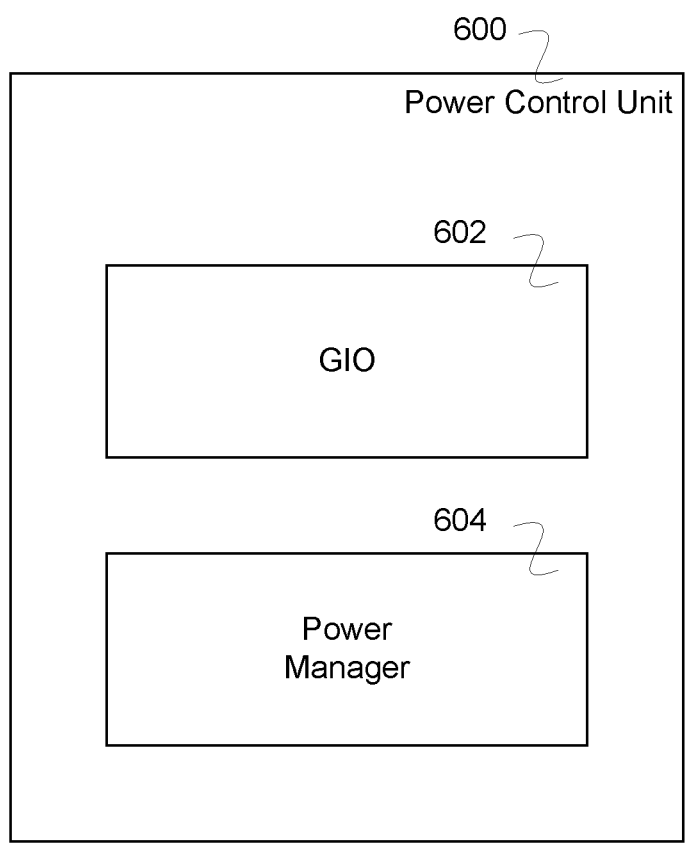
FIG. 6 is a diagram illustrating an embodiment of a power control unit.

FIG. 6 is a diagram illustrating an embodiment of a power control unit. In some embodiments, power control unit 600 is used to implement power control unit 416 of FIG. 4B or power control unit 436 of FIG. 4C. In the example shown, power control unit 600 includes GIO 602 and power manager 604. GIO 602 supports trigger inputs and uses these inputs to control power outputs. Power manager 604 either provides parallel power to a 'Y' to supply a sensor unit or provides either system switched power or parallel power to a sensor unit. In the case where power control unit 600 selects system switched power or parallel power to provide to a sensor unit, internal back current protection (e.g., using diodes) is provides.

FIG. 7A is a diagram illustrating an embodiment of a 'Y' connector. In some embodiments, 'Y' 700 is used to implement 'Y' 420 of FIG. 4B. In the example shown, 'Y' 700 includes base of 'Y' connector 702 (J1), first branch of 'Y' connector 704 (J2), second branch of 'Y' for power connector 708, and second branch of 'Y' for video connector 706 (J3). Base of 'Y' connector 702 (J1) comprises a connector (e.g., a mini Deutsches Institut für Normung (DIN) 6 position, or any other appropriate connector). In some embodiments, first branch of 'Y' connector 704 (J2) comprises a [??] connector. In some embodiments, second branch of 'Y' for power connector 708 comprises a solid or braided wire (e.g., 20 american wire gauge copper). In some embodiments, second branch of 'Y' for video connector 706 (J3) comprises a coax connector (e.g., a Bayonet Neill-Concelman (BNC) coaxial cable connector).

FIG. 7B is a diagram illustrating an embodiment of a 'Y' connector. In some embodiments, 'Y' 710 corresponds to 'Y' 700 of FIG. 7A. In the example shown, 'Y' 710 includes base of 'Y' connector 712 (J1), first branch of 'Y' connector 714 (J2), second branch of 'Y' for power connector 718, and second branch of 'Y' for video connector 716 (J3). Base of 'Y' connector 712 (J1) includes 7 contacts of which contact 1, contact 4, and contact 5 are part of the 'Y' splitting, whereas contact 2, contact 3, contact 6, and contact 7 pass straight to first branch of 'Y' connector 714 (J2). Contact 1 and contact 5 are connected to and second branch of 'Y' for video connector 716 (J3) to split video from base of 'Y' connector 712 (J1) with first branch of 'Y' connector 714 (J2). Contact 4 is connected to power connector 718 from the base of 'Y' connector 712 (J1) to split power with first branch of 'Y' connector 714 (J2). Note that 'Y' 710 includes a diode on the path from contact 4 of base of 'Y' connector 712 (J1) to contact 4 of first branch of 'Y' connector 714 (J2) and on the path from contact 4 of base of 'Y' connector 712 (J1) to power connector 718. These two diodes prevent back current to power supply inputs ultimately being OR'ed to supply power to a sensor unit on a vehicle. In some embodiments, the diode on the line to power connector 718 is not present and is located in the PCU.

FIG. 7C is a table illustrating an embodiment of a 'Y' connector. In some embodiments, 'Y' 720 corresponds to 'Y' 710 of FIG. 7B. In the example shown, 'Y' 720 includes base of 'Y' connector J1, first branch of 'Y' connector J2, second branch of 'Y' for power connector V_IN, and second branch of 'Y' for video connector J3. Base of 'Y' connector J1 includes 7 contacts of which contact 1 (yellow—video), contact 4 (red—12V+), and contact 5 (black—ground) are part of the 'Y' splitting, whereas contact 2 (blue—trig), contact 3 (white—reserved), contact 6 (grey—video shield), and contact 7 (black—DIN shield) pass straight to first branch of 'Y' connector J2. Contact 1 and contact 5 are connected to and second branch of 'Y' for video connector J3 to split video from base of 'Y' connector J1 with first branch of 'Y' connector J2. Contact 4 is connected to power connector V_IN from the base of 'Y' connector J1 to split power with first branch of 'Y' connector J2.

In various embodiments, a 'Y' connector includes 4, 5, 6, 7, or any other appropriate number of wires. The 'Y' connector comprises a multiple contact connector with multiple connections (e.g., 2, 3, 4, 5, 6, 7, or any other appropriate number of electrical connections).

In some embodiments, video splitting includes a buffer to isolate and boost signal as it is split as opposed to passively splitting—this can be important in the event that the video signal is not strong enough to be split passively.

Figure 8:
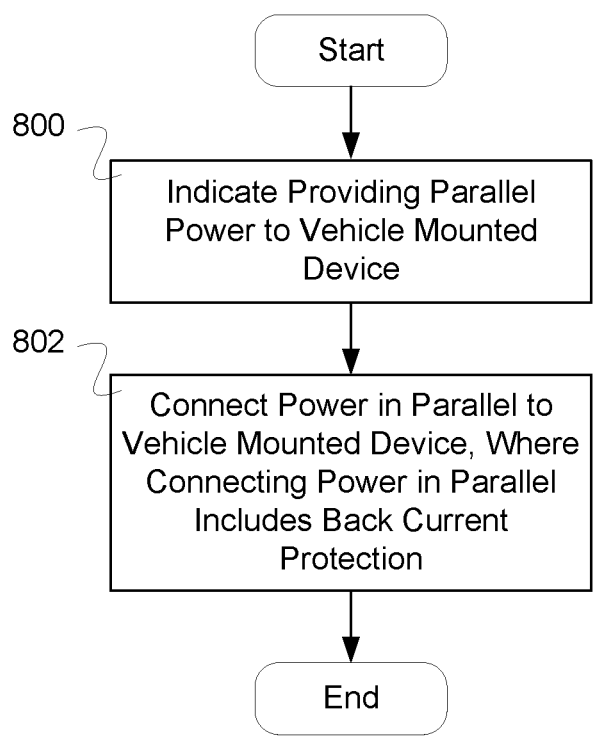
FIG. 8 is a flow diagram illustrating an embodiment of a method for independent power control.

FIG. 8 is a flow diagram illustrating an embodiment of a method for independent power control. In some embodiments, the process of FIG. 8 is implemented using sensor power system 112 of FIG. 1. In the example shown, in 800 providing parallel power to a vehicle mounted device is indicated. In 802, power is connected in parallel to a vehicle mounted device, where connecting the power in parallel includes back current protection.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system for providing power, comprising:
  a control configured to indicate providing parallel power to a vehicle mounted device using a 'Y' cable, wherein a base of the 'Y' provides power to the vehicle mounted device and receives a device output signal from the vehicle mounted device, wherein a first branch of a top of the 'Y' receives vehicle system provided power to power the vehicle mounted device via the base of the 'Y' and provides device output signal from the base of the 'Y', and wherein a second branch of the top of the 'Y' receives parallel power to power the vehicle mounted device via the base of the 'Y' with the back current protection, and also provides device output signal from the base of the 'Y';
a switch configured to connect power in parallel to the vehicle mounted device, wherein connecting power in parallel includes back current protection; and
a hub configured to:
trigger a power control unit to provide power to the vehicle mounted device from the vehicle system provided power and parallel power with back current protection; and
receive signal data from the vehicle mounted device.

2. The system as in claim 1, wherein the back current protection uses a diode.

3. The system as in claim 1, wherein the first branch of the top of the 'Y' that receives vehicle system provided power includes a second back current protection so that in the event that the vehicle system provided power is off there is no back current provided when the parallel power is on.

4. The system as in claim 3, wherein the second back current protection comprises a diode.

5. The system as in claim 1, wherein the switch is part of the power control unit.

6. The system as in claim 1, wherein the vehicle system provided power also includes a second back current protection.

7. The system as in claim 6, wherein the second back power protection comprises a diode.

8. The system as in claim 1, wherein the vehicle mounted device comprises one of the following: a camera, a video camera, a distance sensor, a sonar sensor, a lidar sensor, a radar sensor, a stereo camera sensor, an audio sensor, a laser sensor, an IR sensor, or a lane detection sensor.

9. The system as in claim 1, wherein the indicating providing parallel power comprises triggering the switch to provide parallel power.

10. The system as in claim 1, wherein the power provided in parallel is sourced from a vehicle power source.

11. The system as in claim 10, wherein the vehicle power source comprises a battery or alternator.

12. The system as in claim 1, wherein the vehicle mounted device is also powered from using the vehicle system provided power that is switched on in the event that a vehicle system desires to receive a signal from the vehicle mounted device.

13. The system as in claim 12, wherein the vehicle system provided power is sourced from a vehicle power source.

14. The system as in claim 13, wherein the vehicle power source comprises a battery or alternator.

15. A method for providing power, comprising:
indicating providing parallel power to a vehicle mounted device using a 'Y' cable, wherein a base of the 'Y' provides power to the vehicle mounted device and receives a device output signal from the vehicle mounted device, wherein a first branch of a top of the 'Y' receives vehicle system provided power to power the vehicle mounted device via the base of the 'Y' and provides device output signal from the base of the 'Y', and wherein a second branch of the top of the 'Y' receives parallel power to power the vehicle mounted device via the base of the 'Y' with the back current protection, and also provides device output signal from the base of the 'Y';
connecting power in parallel to the vehicle mounted device, wherein connecting power in parallel includes back current protection;
triggering a power control unit to provide power to the vehicle mounted device from vehicle system provided power and parallel power with back current protection; and
receiving signal data from the vehicle mounted device.

16. A computer program product for providing power, the computer program product being embodied in a non-transitory computer readable storage medium and comprising computer instructions for:
indicating providing parallel power to a vehicle mounted device using a 'Y' cable, wherein a base of the 'Y' provides power to the vehicle mounted device and receives a device output signal from the vehicle mounted device, wherein a first branch of a top of the 'Y' receives vehicle system provided power to power the vehicle mounted device via the base of the 'Y' and provides device output signal from the base of the 'Y', and wherein a second branch of the top of the 'Y' receives parallel power to power the vehicle mounted device via the base of the 'Y' with the back current protection, and also provides device output signal from the base of the 'Y';
causing connecting power in parallel to the vehicle mounted device, wherein connecting power in parallel includes back current protection;
triggering a power control unit to provide power to the vehicle mounted device from vehicle system provided power and parallel power with back current protection; and
receiving signal data from the vehicle mounted device.

17. The system as in claim 1, wherein the hub is configured to provide the received signal data to a vehicle event recorder.

* * * * *